United States Patent [19]

Beun

[11] 4,386,388
[45] May 31, 1983

[54] PRINTED CIRCUIT BOARD ASSEMBLY
[75] Inventor: Roger A. Beun, Dunrobin, Canada
[73] Assignee: Northern Telecom Limited, Montreal, Canada
[21] Appl. No.: 299,794
[22] Filed: Sep. 4, 1981
[51] Int. Cl.³ .................... H05K 5/04; H05K 7/14
[52] U.S. Cl. .................... 361/399; 174/35 R; 174/35 MS; 361/394; 361/395; 361/424
[58] Field of Search ........... 361/394, 399, 424, 391; 174/35 MS, 35 TS, 35 R, 36

[56] References Cited

U.S. PATENT DOCUMENTS

| 2,682,018 | 6/1954 | Phillips | 174/35 R |
|---|---|---|---|
| 3,300,687 | 1/1967 | Hennessey | 361/395 |
| 3,349,289 | 10/1967 | Mueller | 361/394 |
| 3,506,877 | 4/1970 | Owen | 361/395 X |
| 3,566,190 | 2/1971 | Huebner et al. | 361/394 X |
| 3,808,506 | 4/1974 | Lang | 361/394 |
| 4,138,711 | 2/1979 | Bremenour et al. | 361/424 |
| 4,215,796 | 8/1980 | Johnston | 174/35 R X |
| 4,295,181 | 10/1981 | Chang et al. | 361/394 X |
| 4,300,016 | 11/1981 | Bergeron et al. | 361/424 X |

FOREIGN PATENT DOCUMENTS 2747894  3/1979  Fed. Rep. of Germany ...... 361/424

OTHER PUBLICATIONS

Scanbe Manufacturing Corp., EMI/RFI Shielded Electronic Packaging Catalog.

Primary Examiner—R. R. Kucia
Attorney, Agent, or Firm—John E. Mowle

[57] ABSTRACT

A protective cover formed from sheet aluminum, which is used to provide both electrical shielding and mechanical protection for a printed circuit board and its components. The abutting edges of the tubular cover are held in contiguous relationship when the cover is in place, by inturned edges which engage small notches in end plates which are affixed to the printed circuit board.

2 Claims, 3 Drawing Figures

PRINTED CIRCUIT BOARD ASSEMBLY

This invention relates to a printed circuit board assembly more particularly to an economical construction for its protective cover.

BACKGROUND OF THE INVENTION

Printed circuit boards are often vertically mounted in racks utilizing a pair of end plates affixed at opposed ends of the board so as to provide both support for the board and spacing for the electrical components mounted thereon. In addition, one of the end plates may also function as a multicontact electrical plug for connecting the board to external circuitry.

In many applications a tubular cover generally rectangular in cross-section, is used to provide both electrical shielding and mechanical protection for the board and its electrical components. Typically, the cover is formed from sheet aluminum which is then welded and ground, lap jointed and spot welded, or dovetailed and staked along its abutting seam. All of these operations substantially increase the cost of making the protective cover. Alternately, the cover may be cut from an extruded aluminum tube. However, this is a relatively expensive structure, compared to the cost of such covers formed from sheet aluminum.

STATEMENT OF THE INVENTION

It has been found that a relatively economical yet effective cover for such an assembly can be provided by forming the cover from sheet metal to have an unfastened butt seam along its length. In addition, the cover has inturned edges along the seam which engage notches on the facing edges of the end plates so as to prevent the seam from separating. Since both the inturned edges on the sheet metal cover and the notches on the end plates can be readily formed at minimal cost, the overall cost of the printed circuit board assembly is significantly reduced.

BRIEF DESCRIPTION OF THE DRAWINGS

An example embodiment of the invention will now be described with reference to the accompanying drawings in which.

DESCRIPTION OF THE PREFERRED EMBODIMENT

Figure 1:
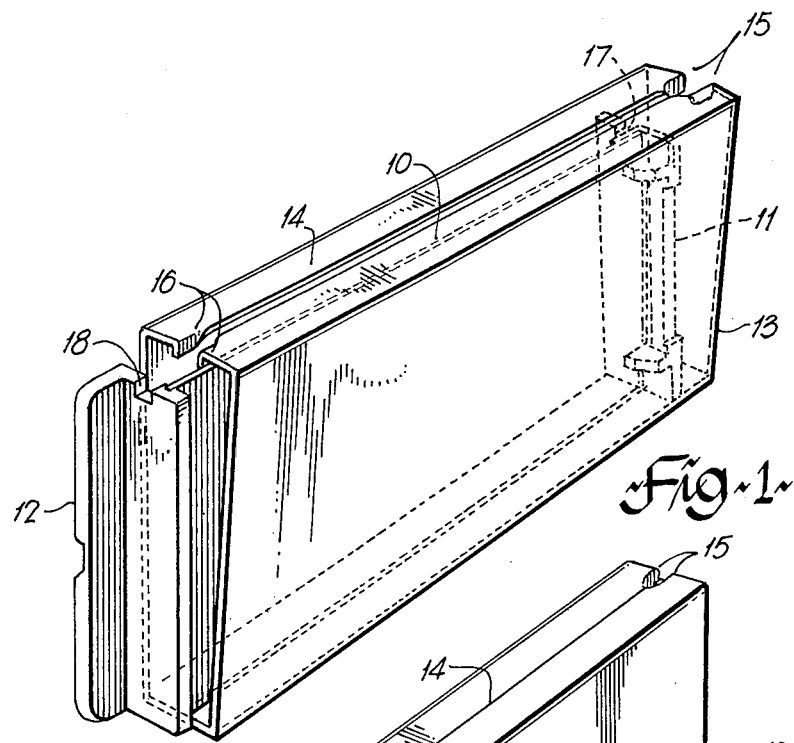
FIG. 1 is a perspective view of a partially disassembled printed circuit board assembly in accordance with the present invention.
Figure 2:
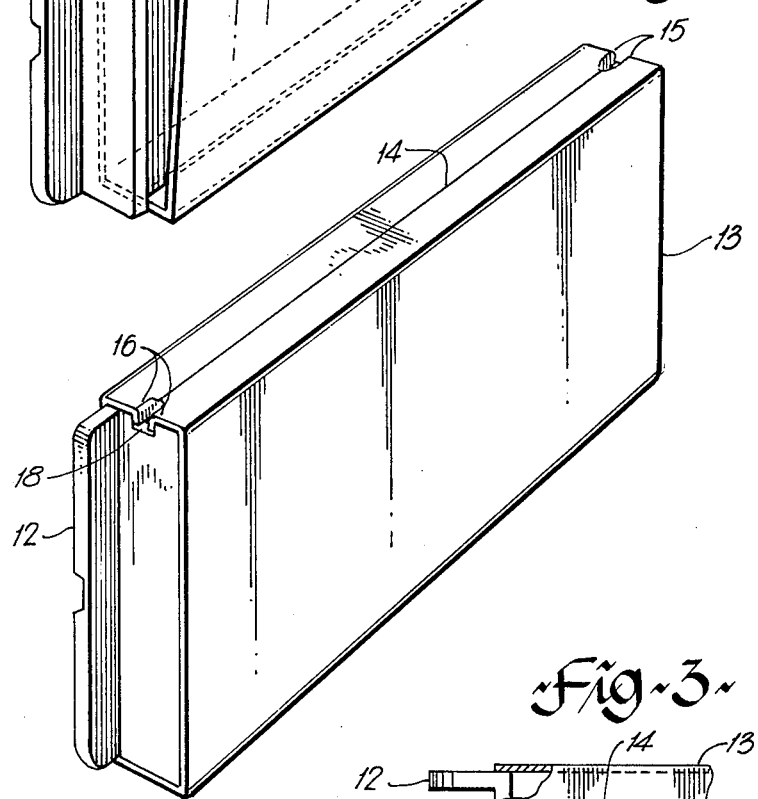
FIG. 2 is an assembled view of the printed circuit board assembly illustrated in FIG. 1.
Figure 3:
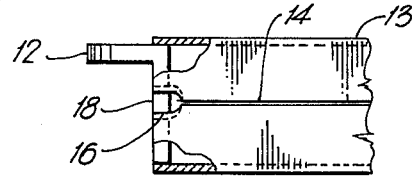
FIG. 3 is a plan view, partially in cross-section of one end of the printed circuit board assembly illustrated in FIG. 2.

Referring to FIGS. 1 to 3, the printed circuit board assembly comprises a printed circuit board 10 on which a number of electrical components (not shown) may be mounted in a well-known manner. A pair of moulded plastic end plates 11 and 12 are affixed in well-known manner to opposed ends of the board 10. In addition, the assembly includes a protective cover 13 which is formed from sheet aluminum so as to have a rectangular cross-section which slidably fits over the end plates 11 and 12.

In FIG. 1, it can be seen that the cover 13 has an unfastened butt seam 14 along its length. Because the cover 13 is formed from relatively thin sheet aluminum in order to reduce both cost and weight, there is a natural tendency for a gap to be present along the seam 14 as shown in FIG. 1. As discussed in the opening paragraphs, there are a number of known solutions to eliminating this gap. However, they tend to significantly increase the cost of this component which reflects in the overall cost of the assembly.

Elimination of this gap in the seam 14, is achieved in the present invention by providing inturned edges 15 and 16 at the ends of the seam 14. These edges engage notches 17 and 18 in each of the end plates 11 and 12. During assembly, the sides of the cover 13 are pressed together so that the edges of the seam 14 butt together. The cover 13 is then slid along the board until the inturned edges 15 and 16 engage the notches 17 and 18. The cover 13 then may be held in place by any convenient means such as a screw which passes through the cover 13 into one of the end plates 11 or 12. Both FIGS. 2 and 3 illustrate the cover in a completely assembled position with the notches 17 and 18 holding the edges of the seam 14 in abutting relationship.

In an alternate embodiment, the entire length of the seam 14 could be inturned. However, the present arrangement in which only the end portions 15 and 16 are inturned, proved to be both economical and satisfactory.

Since the notches 17 and 18 can be readily formed in the moulded plastic end plates 11 and 12 and the cost of providing the inturned portions 15 and 16 of the seam 14 is minimal, the overall result is an economical structure for a dust cover for the printed circuit board assembly.

What is claimed is:

1. In a printed circuit board assembly, comprising:
   a printed circuit board for mounting electrical components thereon;
   a pair of end plates affixed at opposed ends of the board;
   a tubular protective cover supported at its ends by the pair of end plates in spaced relationship with respect to both sides of the board;
   the improvement comprising:
   the protective cover being formed from sheet metal and having an unfastened butt seam along its length;
   each of the end plates having a notch on an edge facing the seam; and
   the cover having inturned edges along the seam for engaging each notch so as to prevent separation of the seam.

2. A printed circuit board assembly as defined in claim 1 in which the inturned edges of the seam are contiguous the notches only.

* * * * *